United States Patent [19]

Ueno et al.

[11] Patent Number: 4,841,172

[45] Date of Patent: Jun. 20, 1989

[54] BIPOLAR-MOS LOGIC CIRCUIT WITH HIGH SPEED OPERATION

[75] Inventors: Masaji Ueno; Hideaki Masuoka, both of Kanagawa, Japan

[73] Assignee: Kabushiki Kaisha Toshiba, Kanagawa, Japan

[21] Appl. No.: 225,495

[22] Filed: Jul. 28, 1988

[30] Foreign Application Priority Data

Aug. 5, 1987 [JP] Japan .................... 62-194527

[51] Int. Cl.$^4$ .................. H03K 17/04; H03K 19/013; H03K 17/62
[52] U.S. Cl. ................................ 307/443; 307/446; 307/456; 307/263; 307/570
[58] Field of Search ............... 307/443, 446, 544, 570, 307/263, 315, 456, 475, 454

[56] References Cited

U.S. PATENT DOCUMENTS

| | | | |
|---|---|---|---|
| 4,430,585 | 2/1984 | Kirk, Jr. ........................... | 307/456 |
| 4,623,803 | 11/1986 | Thompson et al. ................ | 307/456 |
| 4,737,665 | 4/1988 | Ovens ................................. | 307/456 |
| 4,746,817 | 5/1988 | Banker et al. .................... | 307/446 |

OTHER PUBLICATIONS

Japanese Laid Open (Kokai), 57-20027, Feb. 2, 1982.

Primary Examiner—Stanley D. Miller
Assistant Examiner—Timothy P. Callahan
Attorney, Agent, or Firm—Finnegan, Henderson, Farabow, Garrett, & Dunner

[57] ABSTRACT

A logic circuit comprises a current control means including first and second MOS transistors for controlling the current to the output circuit and also for controlling the output wave form, in accordance with the input signal and the output signal. When the output signal rises from a low level to a high level, a large current is supplied to the output circuit to get a steep rise. When the output signal is high level, the current to the output circuit becomes small, and the power consumption is reduced.

7 Claims, 5 Drawing Sheets

BIPOLAR-MOS LOGIC CIRCUIT WITH HIGH SPEED OPERATION

BACKGROUND OF THE INVENTION

1. Field of the invention

This invention concerns logic circuits which are capable of high-speed operation with low power consumption.

2. Description of the Prior Art

For logic circuits of which high-speed and high load driving capacity are required, TTL type logic circuits are frequently used.

FIG. 1 is a circuit diagram of a TTL type NAND gate circuit. In the NAND gate circuit shown in FIG. 1, the base electrode of an NPN type Schottky barrier bipolar transistor (hereafter called an "S bipolar transistor") Q1 is connected to an input terminal A via a diode D1 and, at the same time, is connected to another input terminal B via a diode D2. The conductivity of the S bipolar transistor Q1 is controlled according to the input signals applied to the input terminals A and B. The base electrode of an NPN bipolar transistor Q2 is connected to the emitter electrode of the S bipolar transistor Q1. The conductivity of the S bipolar transistor Q2 is controlled by the S bipolar transistor Q1. A resistor R1 is inserted between the collector electrode of the S bipolar transistor Q2 and a voltage source terminal Vcc. The current flowing in the resistor R1 is controlled by the S bipolar transistor Q2. The base electrode of an NPN type S bipolar transistor Q3 is connected to the collector electrode of the S bipolar transistor Q2. The emitter electrode of an NPN bipolar transistor Q4, which is in a Darlington-connection with the S bipolar transistor Q3, is connected to an output terminal OUT.

The bipolar transistor Q4 and an NPN type S bipolar transistor Q5, the base electrode of which is connected to the emitter electrode of the bipolar transistor Q2, are connected in totem-pole configuration between the voltage source terminal Vcc and the ground terminal GND. The collector electrode of the S bipolar transistor Q5 is connected to the output terminal OUT. The conductivity of the bipolar transistor Q4 and the S bipolar transistor Q5 is controlled by the S bipolar transistor Q2. The base current of the S bipolar transistor Q3 is regulated by the resistor R1. The base electrode of the bipolar transistor Q4 and the output terminal OUT are respectively connected to the collector electrode of the S bipolar transistor Q2 via corresponding Schottky barrier diodes D3 and D4.

In this circuit, when the S bipolar transistor Q2 changes from the conducting state to the non-conducting state, the base potential of the S bipolar transistor Q3 rises according to a time constant determined by the resistor R1 and the parasitic capacitance which exists in the S bipolar transistor Q2 and diodes D3 and D4.

. Here, when the resistance value of the resistor R1 is small, the base potential of the S bipolar transistor Q3 rises, as shown by a in FIG. 2. When the base potential exceeds Vbe (base to emitter voltage), the S bipolar transistor Q3 and the bipolar transistor Q4 changes into the conductive state and an output signal with a steep rise is outputted from the output terminal OUT, as shown by b in FIG. 2.

On the other hand, when the resistance value of the resistor R1 is large, since the current flowing in the resistor R1 is less than that of when the resistance value is small, the rise of the base potential of the S bipolar transistor Q3 is more gentle than in the case of a, as shown by c in FIG. 2. For this reason, the rise of the output signal becomes more gentle than in the case of b as shown by d in FIG. 2, and thus the rise of the output signal is delayed.

As explained above, the rising rate of the base potential of the S bipolar transistor Q3 depends on the resistance value of the resistor R1. Thus the rising of the output signal also depends on the resistance value of the resistor R1.

Therefore, in order to speed up the rising rate of the output signal, it is desirable to make the resistance value of the resistor R1 small. However, if the resistance value of the resistor R1 is made smaller, the current flowing in the resistor R1 increases. Thus, a problem of increasing the power consumption of the entire circuit occurs.

On the other hand, if the resistance value of the resistor R1 is made larger, the power consumption of the entire circuit becomes smaller than when the resistance value of the resistor R1 is small. However, on the contrary, the rising rate of the output signal is slower, and thus the speed of operation becomes slower.

SUMMARY OF THE INVENTION

Therefore, an object of this invention is to provide a logic circuit which is capable of high speed operation with low power consumption.

Another object of this invention is to provide a logic circuit in which the wave form of the output can be modified voluntarily.

In order to achieve the above object, this invention provides a logic circuit for supplying an output signal having a prescribed waveform and one of two levels in response to a prescribed input signal and a power source voltage, which comprises: output circuit means for generating the output signal, including first and second output transistor means for alternately providing a first level output signal and a second level output signal; resistive means responsive to the power source voltage for supplying a current to the first output transistor means; current control means connected in parallel with the resistive means for controlling the current supplied to the first output transistor means, including first and second MOS transistor means for controlling the waveform of the first level output signal in accordance with the ratio of the channel length to the width of the first and second MOS transistor means; and output control means for controlling the first and second output transistor means in response to the input signal for supplying one of the first level output signal and the second level output signal.

In the circuit of this invention, a large current is supplied to the output circuit means when the output signal changes from a low level to a high level. Therefore, the high rising rate, namely the high speed operation is obtained. When the circuit is in the static state or the output signal is high level, the current control means operates to supply a small current to the output circuit means. Therefore, the power consumption is reduced.

DESCRIPTION OF THE PREFERRED EMBODIMENTS

Figure 1:
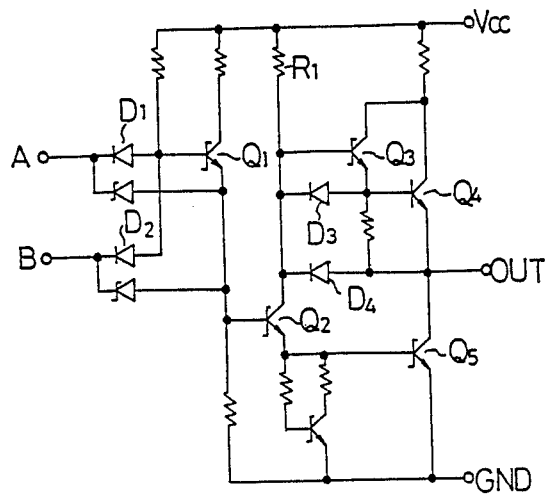
FIG. 1 is a circuit diagram of a conventional logic circuit.
Figure 2:
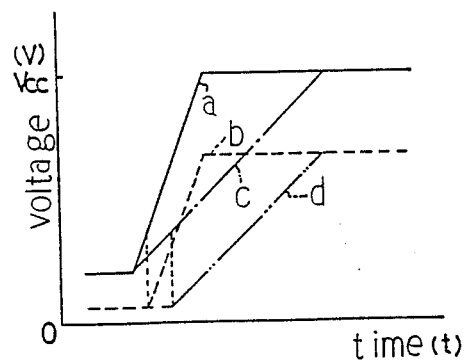
FIG. 2 is an illustration showing the operation of the logic circuit shown in FIG. 1.
Figure 3:
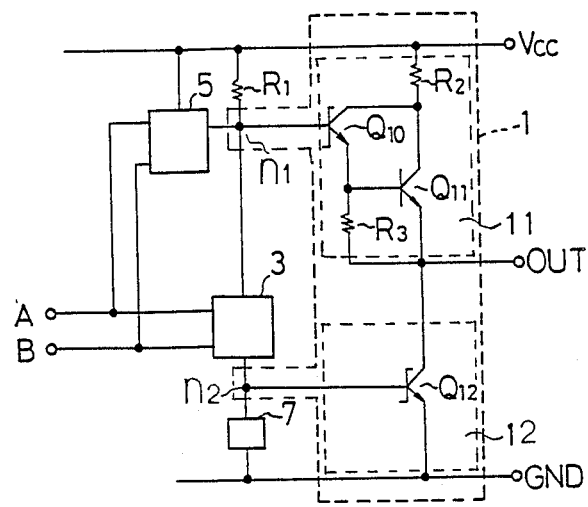
FIG. 3 is a schematic block diagram of a logic circuit of this invention.

FIG. 3 is a schematic block diagram of a logic circuit of an embodiment of this invention. The logic circuit shown in FIG. 3 executes logic operations on input signals applied to input terminals A and B. This logic circuit comprises an output unit 1, an output control circuit 3, a current control unit 5, a resistor R1 and a discharge unit 7. The output unit 1 supplies the logic operation results to an output terminal OUT. The output control unit 3 receives the input signals and controls the output unit 1. The current control unit 5 controls the current supplied to the output unit 1 according to the input signals.

The output unit 1 is provided with a first output section 11 including a Darlington-connected NPN type S bipolar transistor Q10 and a bipolar transistor Q11, and a second output section 12 including an S bipolar transistor Q12 which is connected to the bipolar transistor Q11 in totempole form. The connection of the emitter electrode of the transistor Q11 and the collector electrode of the S transistor Q12 is connected to the output terminal OUT. The base electrodes of the S bipolar transistor Q10 and Q12 are connected to a first node n1 and a second node n2, respectively. The first node n1 is connected to the voltage source terminal Vcc via the resistor R1. The collector electrode of the transistor Q10 is connected to the voltage source terminal Vcc via a resistor R2. The emitter electrode of the transistor Q10 is connected to the output terminal OUT via a resistor R3. When the first output section 11 is in the conductive state, the output level is high. On the contrary, when the second output section 12 is in the conductive state, the output level is low.

The output control unit 3 is inserted between the first node n1 and the second node n2, and controls the conductivity of the S bipolar transistors Q10 and Q12 in the output unit 1, according to the input signals supplied to the input terminals A and B.

The current control unit 5 is connected in parallel with the resistor R1 and controls the base current of the S bipolar transistor Q10 by changing the impedance between the base electrode of the S bipolar transistor Q10 and the voltage source terminal Vcc according to the input signals and the base potential of the S bipolar transistor Q10. As the base potential of the S bipolar transistor Q10 is 2·Vbe higher than the output level, the potential at the first node n1 depends on the output signal level.

The discharge unit 7 is connected between the second node n2 and the ground terminal GND. The discharge unit 7 discharges the base charge of the S transistor Q12 to change the S transistor Q12 from a conductive state to an nonconductive state, and prevents a through current flowing from the voltage source terminal Vcc to the ground terminal GND via the bipolar transistor Q11 and the S bipolar transistor Q12 during the switching operation of the output unit 1.

In this circuit, when the output signal rises from a low level to a high level, namely during the base potential of the S bipolar transistor Q10 is below a predetermined level, the current control unit 5 has a specified impedance. Thus, a parallel connection of the resistor R1 and the current control unit 5 is formed between the voltage source terminal Vcc and the first node n1. Therefore, a larger current is applied to the S bipolar transistor Q10 than in the case when the impedance between voltage source terminal Vcc and the S bipolar transistor Q10 is only the resistance of the resistor R1. Thus, the S bipolar transistor Q10 and the bipolar transistor Q11 change into the conducting state quickly, and so the output signal rises from a low level to a high level very fast.

When the potential at the first node n1 increases and becomes a predetermined potential, the current control unit 5 changes into an open state. In this condition, the voltage source terminal Vcc and the base electrode of the S bipolar transistor Q10 are connected only via the resistor R1. Therefore, the impedance between the voltage source terminal Vcc and the first node n1 increases. Thus, the base current of the S bipolar transistor Q10 decreases in comparison with the case when the first node n1 is connected to the voltage source terminal Vcc via the parallel circuit of the resistor R1 and the current control unit 5. Therefore, when the output signal has become in the high level state and the circuit has become in the static state, the base current of the S bipolar transistor Q10 decreases.

In this way, it is possible to speed up the rising speed of the output signal, and at the same time, to decrease the power consumption compared with the case when the resistor R1 only is connected between the voltage source Vcc and the first node n1.

Figure 4:
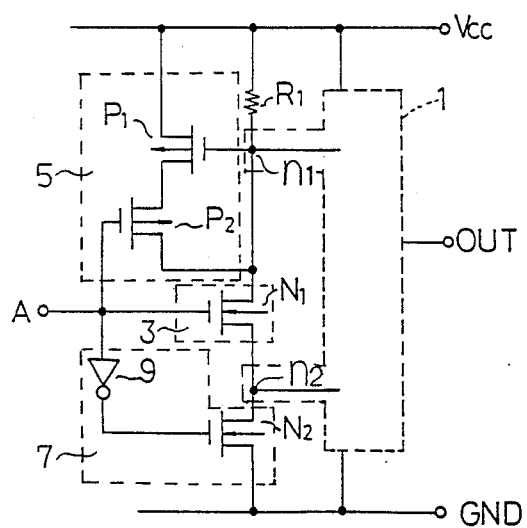
FIG. 4 is a circuit diagram of a practical circuit for the logic circuit shown in FIG. 3.

FIG. 4 is a circuit diagram of a logic circuit constitutes an inverter circuit according to this invention.

In this circuit, an output control unit 3 comprises an N-channelMOS transistor (hereafter called "NMOS") N1. A current control unit 5 is composed of a P-channel MOS transistors (hereafter called "PMOS") P1 and P2. A discharge unit 7 is composed of an NMOS N2 and an inverter 9. An output unit 1 is of the same composition as in FIG. 3. The NMOS N1 is connected between the first node n1 and the second node n2, and the gate electrode thereof is connected to an input terminal A to which the input signal is applied. The NMOS N2 is connected between the second node n2 and the ground terminal GND, and the gate electrode thereof is connected to the input terminal A via the inverter 9. The PMOS P1 and P2 are connected in series, and are inserted between the voltage source terminal Vcc and the first node n1. The gate electrode of the PMOS P1 is connected to the first node n1, and the gate electrode of the PMOS P2 is connected to the input terminal A.

In this circuit, when the input signal is in the high level, the PMOS P2 and the NMOS N2 are in the nonconducting state, and the NMOS N1 is in the conducting state, respectively. In this state, the S bipolar transistor Q12, the base electrode thereof is connected to the second node n2, is supplied with the base current from the voltage source terminal Vcc via the resistor R1 and the NMOS N1. Therefore, the S bipolar transistor Q12 is in the conducting state, and the output signal is in a low level. In this state, as the potential at the first node n1 is in low level, the S bipolar transistor Q10 is in the non-conducting state, and the PMOS P1 is supplied with a low level potential at the gate electrode thereof.

When the input signal falls from the high level to a low level, the NMOS N1 changes into the non-conducting state, and the PMOS P1 and P2 change into the conducting state, respectively.

In this way, a parallel connection of the resistor R1 and the series connection of the PMOS P1 and P2 is formed between the voltage source terminal Vcc and the first node n1. Thus, the resistance value between the voltage source terminal Vcc and the first node n1 becomes smaller than that of when the resistor R1 is alone. Thus, a larger current is supplied to the base electrode of the S transistor Q10.

Therefore, by applying a comparatively larger current to the base electrode of the S bipolar transistor Q10 than in the case when the resistor R1 alone, the switching operation of the S bipolar transistor Q10 is performed at high speed, and thus the rising of the output signal from a low level to a high level can be carried out at high speed.

It should be noted that, as the ON resistance of the MOS transistors is determined by the length and the width of the channel region thereof, it is possible to vary the impedance of the current control unit 5. Thus, it is possible to vary or modify the wave form of the output signal voluntary. Namely, the rising of the output is steep, a high frequency noise is easily occured. Thus, when such noise is unfavorable, it is possible to make the rising gentle by changing the impedance of the current control unit 5.

In the static state, when the the output signal and the potential at the first node n1 are in the high level, the PMOS P1 is in the non-conducting state. Thus, the current to the base electrode of the S transistor Q10 is supplied via the resistor R1 alone. Therefore, the operating current decreases compared with the case when the parallel connection of the resistor R1 and the PMOS P1 and P2 is formed.

Figure 5:
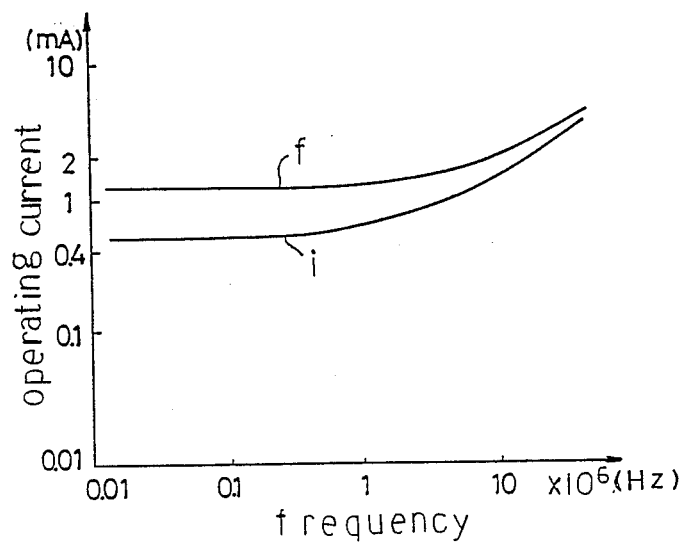
FIG. 5 is a diagram illustrating the characteristic curves of the prior art and the logic circuit shown in FIG. 3.

FIG. 5 is a diagram illustrating a simulation results of the characteristic curves of the prior art and the circuit of FIG. 4. In the diagram, the curve i shows the characteristic of this invention, and the curve f shows the characteristic of the prior art. As apparent from the diagram, the operating current in the low frequency band can be reduced to about half that of prior art, according to this invention.

Figure 6:
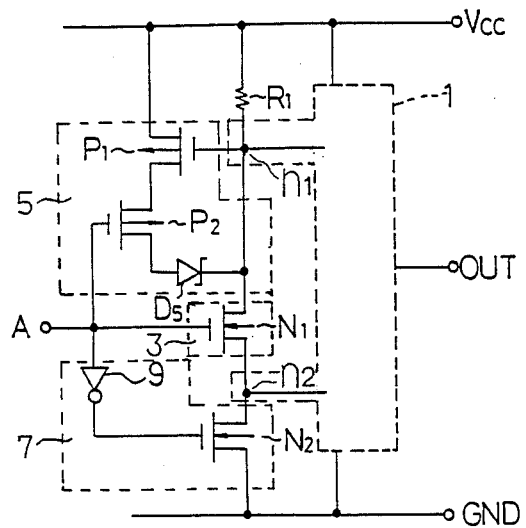
FIGS. 6, 7 and 8 are circuit diagrams of other practical circuits for the logic circuit shown in FIG. 3.

FIG. 6 is a circuit diagram of another embodiment of this invention of a logic circuit which constitutes an inverter circuit. This logic circuit comprises a Schottky barrier diode D5 inserted between the drain electrode of the PMOS P2 and the drain electrode of the NMOS N1, but the remainder of the composition is the same as in the logic circuit shown in FIG. 4.

The diode D5 prevents a charging current from the voltage source terminal Vcc to the parasitic capacitance, which exists at the node of the PMOS P1 and the PMOS P2, via the resistor R1 and the PMOS P2 when the PMOS P1 changes into the non-conducting state. For this reason, the delay of the rising time of the base potential of the S bipolar transistor Q10 can be prevented. Thus, a high speed operation is obtained.

In the inverter circuit shown in FIG. 6, since there is only one node where a parasitic capacitance exists, between the PMOS P1 and PMOS P2, the influence of the charging current to the parasitic capacitance is not so problematic. However, in a multi-input logic circuit, where a number of transistors are connected to the PMOS P1, the parasitic capacitance become larger. Thus, the effect of the insertion of the diode D5 become more notable.

Figure 7:
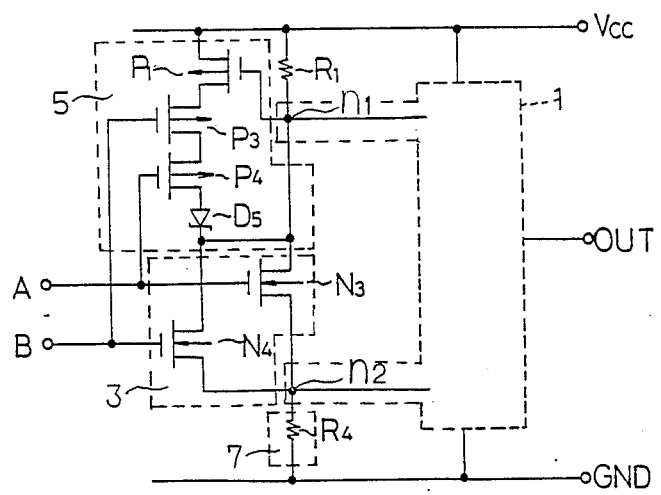

FIG. 7 is a circuit diagram of a further embodiment of this invention of a logic circuit which constitutes a 2-input NOR gate circuit. The output unit 1 is the same as shown in FIG. 3. An output control unit 3 comprises an NMOS N3, whose gate electrode is connected to the input terminal A, and an NMOS N4, whose gate electrode is connected to an input terminal B. The NMOS N3 and the N4 are connected in parallel between the first node n1 and the second node n2. A current control unit 5 comprises PMOS P3 and P4, whose gate electrodes are connected respectively to the corresponding input terminals A and B. A diode D5 is connected between the PMOS P4 and the NMOS N4. A discharge unit 7 is constructed by a resistor R4.

In this circuit, in the same way as in the above embodiments, the impedance between the first node n1 and the voltage source terminal Vcc varies according to the input signal, even though it is a 2-input NOR circuit. Thus, the same kind of effect, namely a high speed operation and a low power consumption, is obtained. Also, by the appropriate modification of the output control unit 3 and the current control unit 5, it is possible to make the logic circuit function as a NAND circuit.

Figure 8:
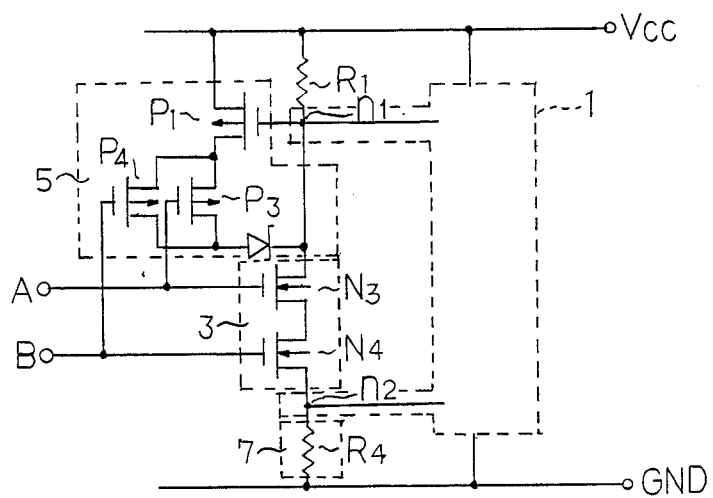

FIG. 8 is an example of an NAND circuit. In this circuit, an output control circuit 3 comprises NMOS N3 and N4, whose gate electrodes are connected to input terminals A and B, respectively. An current control circuit 5 comprises PMOS P1, P3 and P4, and a Schottky barrier diode D5. The PMOS P3 and P4 are connected in parallel, and the gate electrodes thereof are connected to the input terminals A and B, respectively. In this circuit, when the output signal level is low, namely the potential at the first node n1 is in low level, the PMOS P3 or P4, or both, changes into conductive state in responsive to a low level input signal. When, at least one of the PMOS P1 or P2 is conductive state, a parallel connection of the resitor R1 and the PMOS P3 or P4 is formed between the fist node n1 and the sepower source terminal Vcc. In this way, the same kind of effect, namely a high speed operation and a low power consumption, is obtained.

In the logic circuits shown in each of FIGS. 4, 6, 7 and 8, the output control unit 3 is composed of MOS type transistors. However, the invention is not limited to this and, for example, a bipolar transistor may be used. Also, the discharge unit 7 is not limited to a MOS transistor or a resistor and, naturally, any other type of construction may be used.

The present invention has been described with respect to a specific embodiment. However, other embodiments based on the principles of the present invention should be obvious to those of ordinary skill in the art. Such embodiments are intended to be covered by the claims.

What is claimed is:

1. A logic circuit for supplying an output signal having a prescribed waveform and one of two levels in response to a prescribed input signal and a power source voltage, comprising:
   output circuit means for generating the output signal, including first and second output transistor means for alternately providing a first level output signal and a second level output signal;

resistive means responsive to the power source voltage for supplying a current to the first output transistor means;

current control means connected in parallel with the resistive means for controlling the current supplied to the first output transistor means, including first and second MOS transistor means for controlling the waveform of the first level output signal in accordance with the ratio of the channel length to the width of the first and second MOS transistor means; and output control means for controlling the first and second output transistor means in response to the input signal for supplying one of the first level output signal and the second level output signal.

2. The logic circuit of claim 1, wherein the first output transistor circuit means comprises a first bipolar transistor, and the second output transistor circuit means comprises a second bipolar transistor.

3. The logic circuit of claim 2, further comprising;
means for discharging the charge of the second bipolar transistor in response to the input signal.

4. The logic circuit of claim 3, wherein the current control means also includes a Schottky diode connected to the second MOS transistor for limiting current flow to the second MOS transistor means.

5. The logic circuit of claim 1, also including first and second power source terminals; and first and second input terminals for receiving the input signal; and wherein the output control means includes third and fourth MOS transistors each having a gate electrode connected to a corresponding one of the first and second input terminals.

6. The logic circuit of claim 5, wherein the output circuit means includes first and second nodes, the third and fourth MOS transistors being in parallel between the first and second nodes, and the second MOS transistor means includes fifth and sixth MOS transistors each having a gate electrode connected to a corresponding one of the first and second input terminals, and being connected in series between the first MOS transistor means and the second node.

7. The logic circuit of claim 5, wherein the output circuit means includes first and second nodes, the third and fourth MOS transistor s being in series between the first and second nodes, and the second MOS transistors each having a gate electrode connected to a corresponding input terminals, and being connected in parallel between the first MOS transistor means and the second node.

* * * * *